(12) United States Patent
Huang et al.

(10) Patent No.: US 12,648,430 B2
(45) Date of Patent: Jun. 2, 2026

(54) FERROELECTRIC STRUCTURE LINING CONDUCTIVE INTERCONNECT STRUCTURE

(71) Applicant: Taiwan Semiconductor Manufacturing Company, Ltd., Hsinchu (TW)

(72) Inventors: Kuo-Ching Huang, Hsinchu City (TW); Yu-Sheng Chen, Taoyuan City (TW); Yi Ching Ong, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 359 days.

(21) Appl. No.: 18/326,218

(22) Filed: May 31, 2023

(65) Prior Publication Data

US 2024/0274532 A1 Aug. 15, 2024

Related U.S. Application Data

(60) Provisional application No. 63/484,541, filed on Feb. 13, 2023.

(51) Int. Cl.
H10W 20/41 (2026.01)
H10B 51/10 (2023.01)
(Continued)

(52) U.S. Cl.
CPC .......... H10W 20/435 (2026.01); H10B 51/10 (2023.02); H10B 51/30 (2023.02);
(Continued)

(58) Field of Classification Search
CPC ..... H10B 53/00–20; H10D 1/682–688; H10D 30/0415; H10D 30/701; H10D 64/689; H10W 20/435; H10W 20/42
See application file for complete search history.

(56) References Cited

U.S. PATENT DOCUMENTS 6,320,244 B1 * 11/2001 Alers ..................... H10D 1/711
257/532
2002/0019123 A1 2/2002 Ma et al.
(Continued)

OTHER PUBLICATIONS

Jeloka et al. "Energy Efficient Adiabatic FRAM with 0.99 pJ/bit Write for IoT Applications" 2018 IEEE Symposium on VLSI Circuits, published on Oct. 25, 2018.

*Primary Examiner* — Jose R Diaz
(74) *Attorney, Agent, or Firm* — Eschweiler & Potashnik, LLC

(57) ABSTRACT

Various embodiments of the present disclosure are directed towards an integrated chip comprising a ferroelectric structure disposed between a first conductive interconnect structure and a second conductive interconnect structure. The first conductive interconnect structure overlies a substrate. The second conductive interconnect structure overlies the first conductive interconnect structure. The second conductive interconnect structure comprises a conductive wire segment directly overlying a conductive via segment. The ferroelectric structure continuously extends along opposing sidewalls and a bottom surface of the conductive wire segment and along opposing sidewalls and a bottom surface of the conductive via segment.

20 Claims, 12 Drawing Sheets

100

(51) Int. Cl.

| | | |
|---|---|---|
| *H10B 51/30* | (2023.01) | |
| *H10B 53/30* | (2023.01) | |
| *H10D 1/68* | (2025.01) | |
| *H10D 30/01* | (2025.01) | |
| *H10D 30/69* | (2025.01) | |
| *H10D 64/68* | (2025.01) | |
| *H10W 20/42* | (2026.01) | |

(52) U.S. Cl.

CPC ............. *H10B 53/30* (2023.02); *H10D 1/682* (2025.01); *H10D 30/0415* (2025.01); *H10D 30/701* (2025.01); *H10D 64/689* (2025.01); *H10W 20/42* (2026.01)

(56) References Cited

U.S. PATENT DOCUMENTS

| | | | |
|---|---|---|---|
| 2003/0030079 A1 | 2/2003 | Hsu et al. | |
| 2004/0087101 A1* | 5/2004 | Balakumar | ............ H10D 1/684 257/E21.018 |
| 2010/0207166 A1 | 8/2010 | Zhu | |
| 2017/0271434 A1* | 9/2017 | Chou | ................ H01L 23/53238 |
| 2020/0006346 A1 | 1/2020 | Avci et al. | |
| 2020/0013871 A1 | 1/2020 | An et al. | |
| 2020/0395435 A1 | 12/2020 | Haratipour et al. | |
| 2021/0398994 A1 | 12/2021 | Young et al. | |
| 2021/0408117 A1 | 12/2021 | Wu et al. | |
| 2022/0352342 A1 | 11/2022 | An et al. | |
| 2022/0359549 A1 | 11/2022 | Lin et al. | |
| 2023/0017020 A1 | 1/2023 | Chen et al. | |

* cited by examiner

100

1300

1400

1700 ⟍

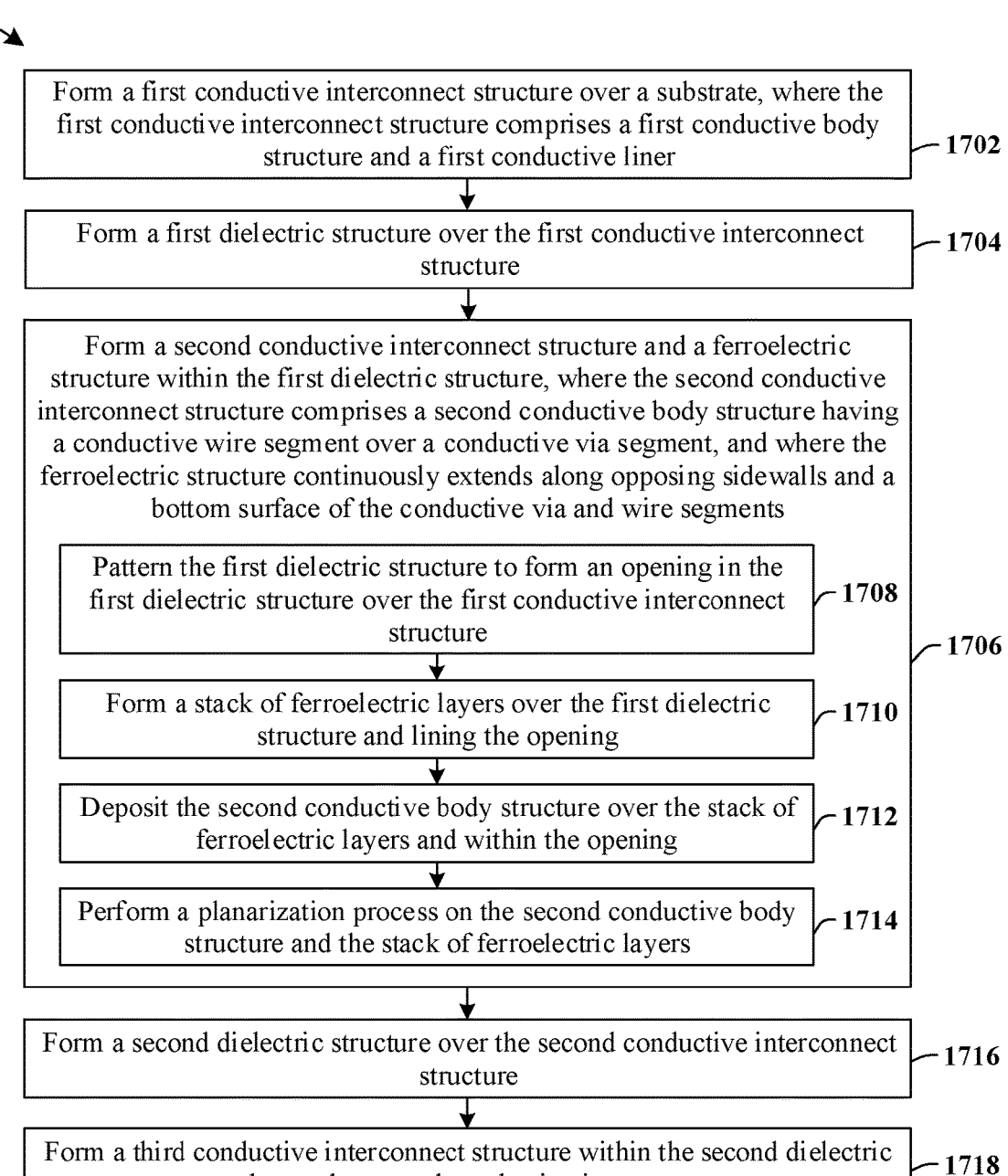

Form a first conductive interconnect structure over a substrate, where the first conductive interconnect structure comprises a first conductive body structure and a first conductive liner ⌐ 1702

Form a first dielectric structure over the first conductive interconnect structure ⌐ 1704

Form a second conductive interconnect structure and a ferroelectric structure within the first dielectric structure, where the second conductive interconnect structure comprises a second conductive body structure having a conductive wire segment over a conductive via segment, and where the ferroelectric structure continuously extends along opposing sidewalls and a bottom surface of the conductive via and wire segments Pattern the first dielectric structure to form an opening in the first dielectric structure over the first conductive interconnect structure ⌐ 1708

Form a stack of ferroelectric layers over the first dielectric structure and lining the opening ⌐ 1710

Deposit the second conductive body structure over the stack of ferroelectric layers and within the opening ⌐ 1712

Perform a planarization process on the second conductive body structure and the stack of ferroelectric layers ⌐ 1714

⌐ 1706

Form a second dielectric structure over the second conductive interconnect structure ⌐ 1716

Form a third conductive interconnect structure within the second dielectric structure and over the second conductive interconnect structure ⌐ 1718

Fig. 17

FERROELECTRIC STRUCTURE LINING CONDUCTIVE INTERCONNECT STRUCTURE

REFERENCE TO RELATED APPLICATION

This Application claims the benefit of U.S. Provisional Application No. 63/484,541, filed on Feb. 13, 2023, the contents of which are incorporated herein by reference in their entirety.

BACKGROUND

Many modern-day electronic devices contain electronic memory configured to store data. Electronic memory may be volatile memory or non-volatile memory. Volatile memory stores data while it is powered, while non-volatile memory is able to store data when power is removed. Ferroelectric random-access memory (FeRAM) devices are one promising candidate for a next generation non-volatile memory technology. This is because FeRAM devices provide for many advantages, including a fast write time, high endurance, low power consumption, and low susceptibility to damage from radiation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 17 illustrates a flowchart of some embodiments of a method for forming an integrated chip comprising a ferroelectric structure disposed along opposing sidewalls and a bottom surface of a conductive interconnect structure.

DETAILED DESCRIPTION

Figure 1:
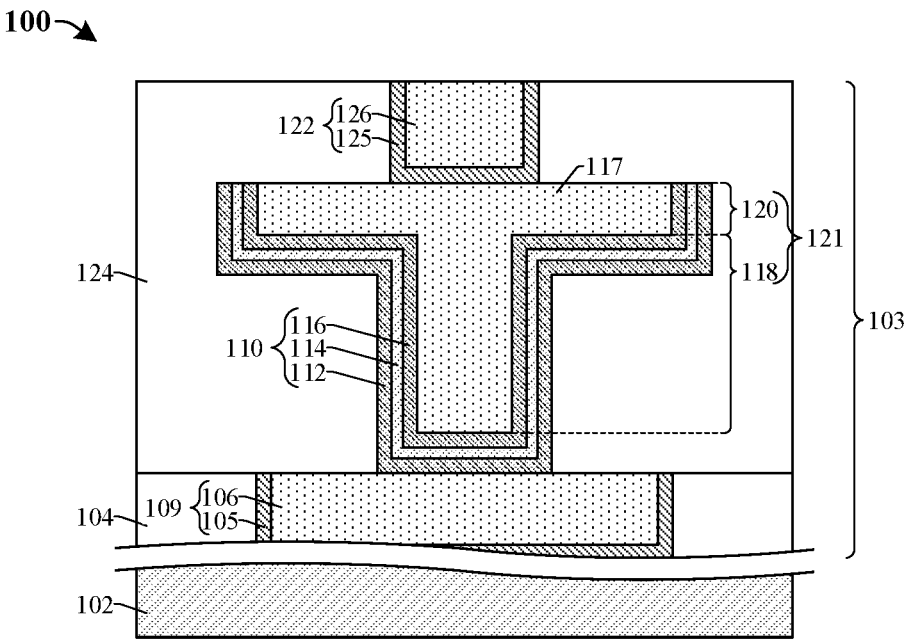
FIG. 1 illustrates a cross-sectional view of some embodiments of an integrated chip comprising a ferroelectric structure disposed along opposing sidewalls and a bottom surface of a conductive interconnect structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Ferroelectric random-access memory (FeRAM) devices may comprise a bottom electrode that is separated from a top electrode by a ferroelectric layer. The ferroelectric layer has an intrinsic dipole that can be switched between a first polarization state and a second polarization state. During operation of a FeRAM device, suitable biasing conditions may be applied between the top and bottom electrodes to switch the ferroelectric layer to the first polarization state or the second polarization state. The first and second polarization states provide the FeRAM device with different capacitances, which can be sensed during a read operation by applying a suitable read voltage to a corresponding bit line. The different capacitances are representative of discrete data states (e.g., a logical "0" or "1"), such that the FeRAM device can digitally store data. A difference between a polarization charge of the ferroelectric layer in the first polarization state and a polarization charge of the ferroelectric layer in the second polarization corresponds to a memory window of the FeRAM device. The FeRAM device may be integrated in a back-end-of-line (BEOL) structure vertically between a first conductive interconnect structure and a second conductive interconnect structure.

As feature sizes of integrated chips are scaled down, an area of the ferroelectric layer between the top and bottom electrodes is decreased. As a result, a memory window of the FeRAM device is decreased, thereby making it difficult to accurately detect a data state of the FeRAM device. In an effort to increase the area of the ferroelectric layer between the top and bottom electrodes, the FeRAM device may be disposed within a trench defined by sidewalls of an interconnect dielectric structure disposed between the first and second conductive interconnect structures. The top electrode, ferroelectric layer, and bottom electrode line the trench, thereby increasing the area of the ferroelectric layer between the top and bottom electrodes. However, forming the FeRAM device in the trench includes performing one or more patterning processes to from the trench and one or more removal processes (e.g., etch process(es), planarization process(es), etc.) to remove excess materials of the top and bottom electrodes and/or the ferroelectric layer from over the trench. This increases costs associated with fabricating the FeRAM device. Further, the trench extending between the first and second conductive interconnect structures occupies space in the interconnect structure that may otherwise be used for electrical routing. Accordingly, design complexity may be increased and/or a number of devices disposed over a single substrate may be decreased.

The present disclosure, in some embodiments, relates to an integrated chip comprising a ferroelectric structure integrated with a corresponding conductive interconnect structure and an associated method. The integrated chip includes a first conductive interconnect structure overlying a substrate and a second conductive interconnect structure overlying the first conductive interconnect structure. The second conductive interconnect structure comprises a conductive body structure having a conductive wire segment directly overlying a conductive via segment. In some embodiments, the ferroelectric structure comprises a first electrode layer, a second electrode layer, and a ferroelectric layer disposed between the first and second electrode layers. Layers of the ferroelectric structure continuously extend along opposing sidewalls and bottom surfaces of the conductive wire segment and the conductive via segment. Disposing layers of the ferroelectric structure along the opposing sidewalls and bottom surfaces of the conductive wire and via segments increases an area of the ferroelectric layer between the first and second electrode layers, thereby increasing a memory window of the ferroelectric structure.

Further, during fabrication of the integrated chip, the first conductive interconnect structure may be formed by a first damascene process (e.g., a single damascene process or a dual damascene process). Subsequently, the ferroelectric structure and the second conductive interconnect structure may be formed by a second damascene process (e.g., a dual damascene process). Thus, the ferroelectric structure and the second conductive interconnect structure may be formed concurrently with one another. As a result, costs and time associated with fabricating the integrated chip are decreased.

FIG. 1 illustrates a cross-sectional view 100 of some embodiments of an integrated chip comprising a ferroelectric structure disposed along opposing sidewalls and a bottom surface of a conductive interconnect structure.

The integrated chip includes a back-end-of-the-line (BEOL) structure 103 overlying a substrate 102. The BEOL structure 103 comprises a first conductive interconnect structure 109, a second conductive interconnect structure 121 over the first conductive interconnect structure 109, and a third conductive interconnect structure 122 over the second conductive interconnect structure 121. The first conductive interconnect structure 109 is disposed within a first dielectric layer 104 and the second conductive interconnect structure 121 is disposed within a second dielectric layer 124. Conductive interconnect structures (e.g., the first, second, and third conductive interconnect structures 109, 121, 122) of the BEOL structure 103 are configured to electrically couple semiconductor devices (e.g., memory devices, transistors, etc.) over and/or on the substrate 102 to one another. In various embodiments, the BEOL structure 103 may be referred to as an interconnect structure.

In some embodiments, the first conductive interconnect structure 109 comprises a first conductive body structure 106 and a first conductive liner 105. The first conductive liner 105 is disposed along opposing sidewalls and a bottom surface of the first conductive body structure 106. In various embodiments, the first conductive liner 105 is configured to reduce or prevent diffusion of a diffusive species (e.g., copper, aluminum, etc.) from the first conductive body structure 106 to other structures in the BEOL structure 103. The third conductive interconnect structure 122 comprises a third conductive body structure 126 and a second conductive liner 125. The second conductive liner 125 of the third conductive interconnect structure 122 is disposed along opposing sidewalls and a bottom surface of the third conductive body structure 126 and is configured to mitigate diffusion of a diffusive species from the third conductive body structure 126 to other structures in the BEOL structure 103.

In various embodiments, the second conductive interconnect structure 121 comprises a second conductive body structure 117 having a conductive wire segment 120 directly overlying a conductive via segment 118. In some embodiments, the second conductive body structure 117 is a single continuous material. The conductive via segment 118 continuously extends from a bottom surface of the conductive wire segment 120 towards the first conductive interconnect structure 109. Opposing sidewalls of the conductive via segment 118 are spaced laterally between opposing sidewalls of the conductive wire segment 120. The integrated chip further includes a ferroelectric structure 110 disposed within the BEOL structure 103 and lining surfaces of the second conductive interconnect structure 121. In some embodiments, the ferroelectric structure 110 includes a first electrode layer 112, a second electrode layer 116, and a ferroelectric layer 114 disposed between the first and second electrode layers 112, 116. The first and second electrode layers 112, 116 and the ferroelectric layer 114 continuously extend along the opposing sidewalls and the bottom surface of the conductive wire segment 120 and along the opposing sidewalls and a bottom surface of the conductive via segment 118. Disposing layers of the ferroelectric structure 110 along the opposing sidewalls and bottom surfaces of the conductive via and wire segments 118, 120 of the second conductive interconnect structure 121 increases an area of the ferroelectric layer 114 between the first and second electrode layers 112, 116, thereby increasing a memory window of the ferroelectric structure 110. Thus, by virtue of the layers of the ferroelectric structure 110 lining the opposing sidewalls and bottom surfaces of the conductive via and wire segments 118, 120, an overall performance of the integrated chip is improved. In various embodiments, the ferroelectric structure 110 may be configured as a metal-ferroelectric-metal (MFM) device.

In yet further embodiments, during fabrication of the integrated chip, the first conductive interconnect structure 109 may be formed by a first damascene process (e.g., a single damascene process or a dual damascene process). Subsequently, the ferroelectric structure 110 and the second conductive interconnect structure 121 are formed by a second damascene process (e.g., a dual damascene process). In such embodiments, the ferroelectric structure 110 and the second conductive interconnect structure 121 are formed concurrently with one another. By forming the ferroelectric structure 110 with the second conductive interconnect structure 121, a number of processing steps utilized to form the ferroelectric structure 110 may be reduced. As a result, costs and time associated with fabricating the integrated chip are decreased. In addition, forming the ferroelectric structure 110 with the second conductive interconnect structure 121 decreases a lateral footprint of the ferroelectric structure 110, thereby increasing a device density of the integrated chip.

Figure 2:
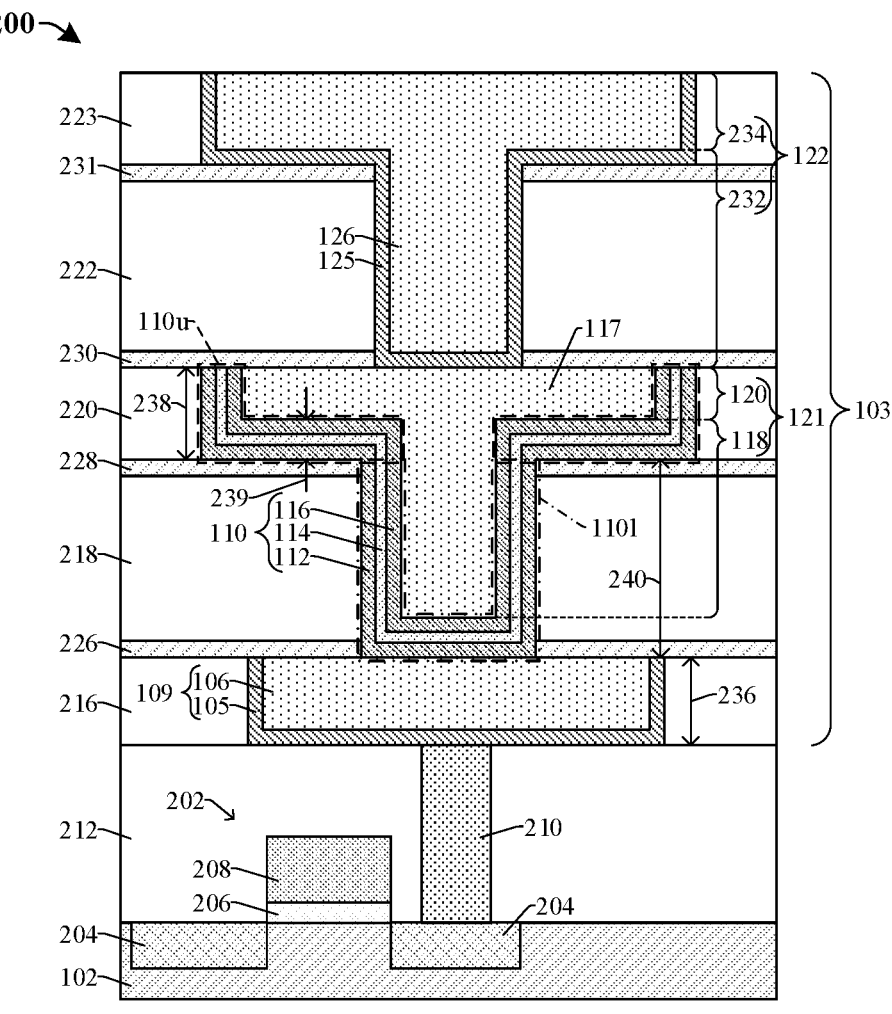
FIG. 2 illustrates a cross-sectional view of some embodiments of an integrated chip having a ferroelectric structure arranged over a transistor.

FIG. 2 illustrates a cross-sectional view 200 of some embodiments of an integrated chip having a ferroelectric structure arranged over a transistor.

The integrated chip includes a transistor 202 disposed within and/or on the substrate 102. The substrate 102 may, for example, be or comprise silicon, monocrystalline silicon, a bulk substrate, a silicon-on-insulator (SOI) substrate, some other suitable substrate, or the like. In various embodiments, the transistor 202 may be a metal-oxide semiconductor field-effect transistor (MOSFET), a bipolar junction transistor (BJT), a high-electric-mobility transistor (HEMT), a fin field-effect transistor (finFET), or the like. The transistor 202 comprises a gate dielectric layer 206 overlying the substrate 102, a gate electrode 208 overlying the gate dielectric layer 206, and a pair of source/drain regions 204 disposed in the substrate 102 on opposing sides of the gate electrode 208. Source/drain region(s) may refer to a source or a drain, individually or collectively dependent upon the context.

A lower dielectric layer 212 overlies the substrate 102. A conductive contact 210 is disposed within the lower dielectric layer 212 and is electrically coupled to the transistor 202. For example, the conductive contact 210 is directly electrically coupled to a first source/drain region in the pair of source/drain regions 204. In some embodiments, a second source/drain region in the pair of source/drain regions 204 is electrically coupled to a source line. In yet further embodiments, the gate electrode 208 is directly electrically coupled to a word line. The conductive contact 210 may, for example, be or comprise tungsten, ruthenium, another conductive material, or the like.

A BEOL structure 103 overlies the conductive contact 210 and the lower dielectric layer 212. In some embodiments, the BEOL structure 103 comprises a plurality of metallization layers disposed within a dielectric structure. The plurality of metallization layers includes a first conductive interconnect structure 109, a second conductive interconnect structure 121, and a third conductive interconnect structure 122. The dielectric structure includes a plurality of etch stop layers 226-231 and a plurality of inter-metal dielectric (IMD) layers 216-223 disposed alternatingly with one another over the lower dielectric layer 212.

The plurality of IMD layers 216-223 may, for example, be or comprise silicon dioxide, a low-k dielectric material such as undoped silica glass (USG), carbon-doped silicon dioxide, or the like, some other suitable dielectric, or any combination of the foregoing. The plurality of etch stop layers 226-231 may, for example, be or comprise silicon nitride, silicon carbide, some other dielectric, or any combination of the foregoing. The plurality of IMD layers 216-223 comprises a first IMD layer 216, a second IMD layer 218, a third IMD layer 220, a fourth IMD layer 222, and a fifth IMD layer 223. The plurality of etch stop layers 226-231 comprises a first etch stop layer 226, a second etch stop layer 228, a third etch stop layer 230, and a fourth etch stop layer 231. In some embodiments, the etch stop layers 226-231 respectively have a thickness greater than about 10 angstroms, within range of about 10 to 500 angstroms, within a range of about 100 to 500 angstroms, or some other suitable value. In various embodiments, the etch stop layers 226-231 each having a thickness greater than about 10 angstroms mitigates damage to underlying layers during etching processes performed during fabrication of the BEOL structure 103. In further embodiments, the IMD layers 216-223 respectively have a thickness greater than about 200 angstroms, within a range of about 200 to 8,000 angstroms, within a range of about 800 to 8,000 angstroms, or some other suitable value.

In various embodiments, the first conductive interconnect structure 109 comprises a first conductive body structure 106 and a first conductive liner 105 disposed along opposing sidewalls and a bottom surface of the first conductive body structure 106. The first conductive body structure 106 may, for example, be or comprise aluminum, copper, ruthenium, some other conductive material, or any combination of the foregoing. The first conductive liner 105 may, for example, be or comprise titanium nitride, tantalum nitride, tantalum, titanium, or the like. A height 236 of the first conductive interconnect structure 109 may, for example, be greater than about 200 angstroms, within a range of about 200 to about 8,000 angstroms, within a range of about 800 to about 8,000 angstroms, or some other suitable value. In further embodiments, the height 236 being greater than about 200 angstroms decreases a resistance in the BEOL structure 103. In some embodiments, a thickness of the first conductive liner 105 is greater than 10 angstroms, within a range of about 10 to 500 angstroms, within a range of about 100 to 500 angstroms, or some other suitable value. In various embodiments, the thickness of the first conductive liner 105 being greater than about 10 angstroms increases an ability for the first conductive liner 105 to suitably prevent or mitigate diffusion of a diffusive species (e.g., copper) from the first conductive body structure 106. In further embodiments, the thickness of the first conductive liner 105 being less than about 500 angstroms decreases resistance of the first conductive interconnect structure 109.

The third conductive interconnect structure 122 overlies the second conductive interconnect structure 121. In some embodiments, the third conductive interconnect structure 122 comprises a third conductive body structure 126 and a second conductive liner 125. In various embodiments, the third conductive body structure 126 has an upper conductive wire segment 234 directly overlying an upper conductive via segment 232. The upper conductive via segment 232 continuously extends from a bottom surface of the upper conductive wire segment 234 towards the second conductive interconnect structure 121. The third conductive body structure 126 may, for example, be or comprise aluminum, copper, ruthenium, some other conductive material, or any combination of the foregoing. The second conductive liner 125 may, for example, be or comprise titanium nitride, tantalum nitride, tantalum, titanium, or the like. In some embodiments, a thickness of the second conductive liner 125 is greater than about 10 angstroms, within a range of about 10 to 500 angstroms, within a range of about 100 to 500 angstroms, or some other suitable value.

The second conductive interconnect structure 121 is disposed vertically between the first conductive interconnect structure 109 and the third conductive interconnect structure 122. The second conductive interconnect structure 121 comprises a second conductive body structure 117 having a conductive wire segment 120 directly overlying a conductive via segment 118. The second conductive body structure 117 may, for example, be or comprise copper, aluminum, ruthenium, some other conductive material, or any combination of the foregoing. In various embodiments, a height of the conductive wire segment 120 is within a range of about 200 to 8,000 angstroms, within a range of about 800 to 8,000 angstroms, or some other suitable value. In some embodiments, the height of the conductive wire segment 120 being greater than 200 angstroms decreases a resistance of the second conductive interconnect structure 121.

A ferroelectric structure 110 is disposed within the BEOL structure 103 between the second conductive interconnect structure 121 and the first conductive interconnect structure 109. The ferroelectric structure 110 continuously extends along opposing sidewalls and a bottom surface of the conductive wire segment 120 and along opposing sidewalls and a bottom surface of the conductive via segment 118. In various embodiments, the ferroelectric structure 110 comprises an upper ferroelectric segment 110u overlying a lower ferroelectric segment 110l. The upper ferroelectric segment 110u is disposed along and directly contacts the opposing sidewalls and the bottom surface of the conductive wire segment 120. A lower portion of the upper ferroelectric segment 110u continuously extends from a top surface of the second etch stop layer 228 to the bottom surface of the conductive wire segment 120. The lower ferroelectric segment 110l is disposed along and directly contacts the opposing sidewalls and the bottom surface of the conductive via segment 118. The first etch stop layer 226 laterally wraps around the lower ferroelectric segment 110l. A width of the upper ferroelectric segment 110u is greater than a width of the lower ferroelectric segment 110l. Further, a height 240 of the lower ferroelectric segment 110l is greater than a height 238 of the upper ferroelectric segment 110u. In various embodiments, the lower ferroelectric segment 110l is U-shaped. In further embodiments, the upper ferroelectric segment 110u is discontinuous in a middle region of the second conductive interconnect structure 121 in which a portion of the conductive via segment 118 is disposed. In yet further embodiments, the height of the conductive wire segment 120 is greater than a thickness 239 of the upper ferroelectric segment 11u.

In some embodiments, the ferroelectric structure 110 comprises a first electrode layer 112, a second electrode layer 116, and a ferroelectric layer 114 disposed between the first and second electrode layers 112, 116. Layers of the ferroelectric layer 114 continuously extend along and conform to sidewalls and bottom surfaces of the conductive via and wire segments 118, 120. Disposing layers of the ferroelectric structure 110 along the opposing sidewalls and bottom surfaces of the conductive via and wire segments 118, 120 of the second conductive interconnect structure 121 increases an area of the ferroelectric layer 114 between the first and second electrode layers 112, 116 while reducing a lateral footprint of the ferroelectric structure 110. This, in part, increases a range of capacitance values of the ferroelectric structure 110, thereby increasing a memory window of the ferroelectric structure 110. As a result, an ability to detect discrete data states of the ferroelectric structure 110 is increased. In further embodiments, during fabrication of the integrated chip the second conductive interconnect structure 121 and the ferroelectric structure 110 are formed concurrently with one another by a damascene process (e.g., a dual damascene process). This reduces a number of processing steps (e.g., a number of etching process(es) and/or planarization process(es)) utilized to form the integrated chip, thereby decreasing fabrication costs.

In some embodiments, a top surface of the second conductive interconnect structure 121 is coplanar with a top surface of the ferroelectric structure 110. The first and second electrode layers 112, 116 may, for example, be or comprise titanium nitride, tantalum nitride, tungsten, indium tin oxide, some other suitable material, or any combination of the foregoing. In various embodiments, thicknesses of the first and second electrode layers 112, 116 are within a range of about 50 to 500 angstroms or some other suitable value. The ferroelectric layer 114 may, for example, be or comprise lead zirconate titanate (PZT), barium titanate (BTO), strontium bismuth tantalate (SBT), a doped metal oxide (e.g., hafnium oxide doped with lanthanum (La), zirconium (Zr), silicon (Si), aluminum (Al), etc.), or some other suitable material. A thickness of the ferroelectric layer 114 may be within a range of about 20 to 80 angstroms or some other suitable value. In some embodiments, the thickness of the ferroelectric layer 114 increases a current across the ferroelectric structure 110, thereby facilitating performing accurate read and/or write processes on the ferroelectric structure 110 while maintaining a low power consumption of the ferroelectric structure 110.

Figure 3A:
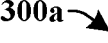
FIGS. 3A and 3B illustrate cross-sectional views of some other embodiments of the integrated chip of FIG. 2, where the ferroelectric structure comprises an insulator layer disposed on a ferroelectric layer.
Figure 3A:
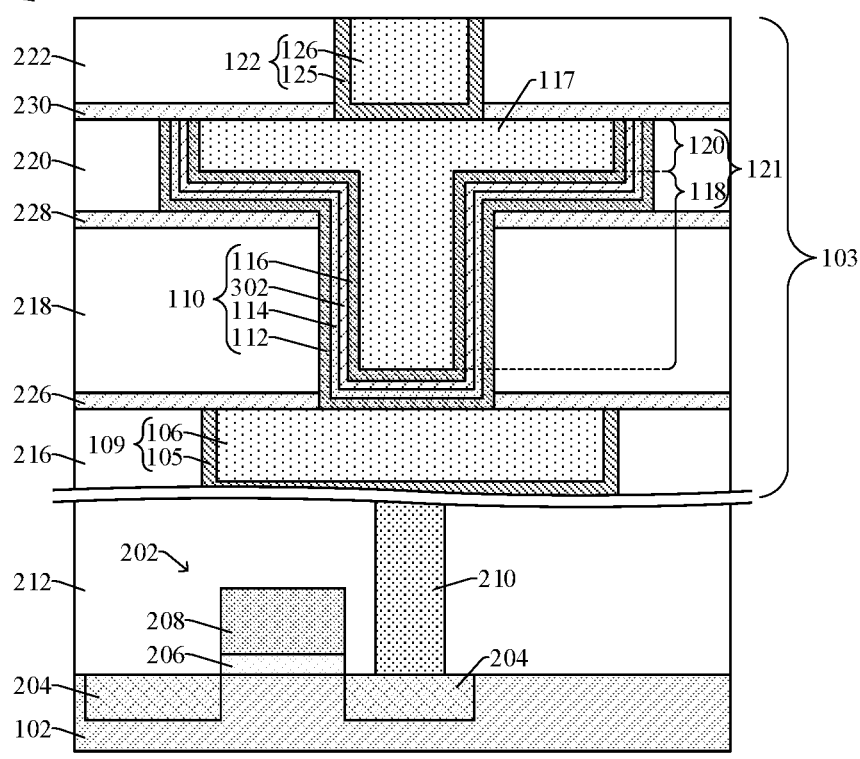

FIG. 3A illustrates a cross-sectional view 300a of some other embodiments of the integrated chip of FIG. 2, in which the ferroelectric structure comprises an insulator layer disposed on a ferroelectric layer.

As illustrated in FIG. 3A, in some embodiments, the ferroelectric structure 110 comprises the first electrode layer 112, the ferroelectric layer 114, an insulator layer 302, and the second electrode layer 116. In such embodiments, the ferroelectric structure 110 is configured as a metal-ferroelectric-insulator-metal (MFIM) device. The insulator layer 302 may, for example, be or comprise an amorphous material (e.g., amorphous silicon dioxide, amorphous aluminum oxide, etc.), a dielectric material such as zirconium oxide (ZrO$_2$), cerium oxide (CeO$_2$), titanium oxide (TiO$_2$), some other suitable material, or the like. In some embodiments, a thickness of the insulator layer 302 is within a range of about 5 to 50 angstroms or some other suitable value. In further embodiments, the thickness of the insulator layer 302 being greater than 5 angstroms facilitates good insulation between the ferroelectric layer 114 and a corresponding electrode layer, thereby increasing performance of the ferroelectric structure 110. In yet further embodiments, the thickness of the insulator layer 302 being less than 50 angstroms increases a current across the ferroelectric structure 110, thereby facilitating performing accurate read and/or write processes on the ferroelectric structure 110 while maintaining a low power consumption of the ferroelectric structure 110. In various embodiments, the thickness of the insulator layer 302 is less than a thickness of the ferroelectric layer 114 and/or less than thicknesses of the first and second electrode layers 112, 116. In some embodiments, the insulator layer 302 is disposed directly between the ferroelectric layer 114 and the second electrode layer 116.

Figure 3B:
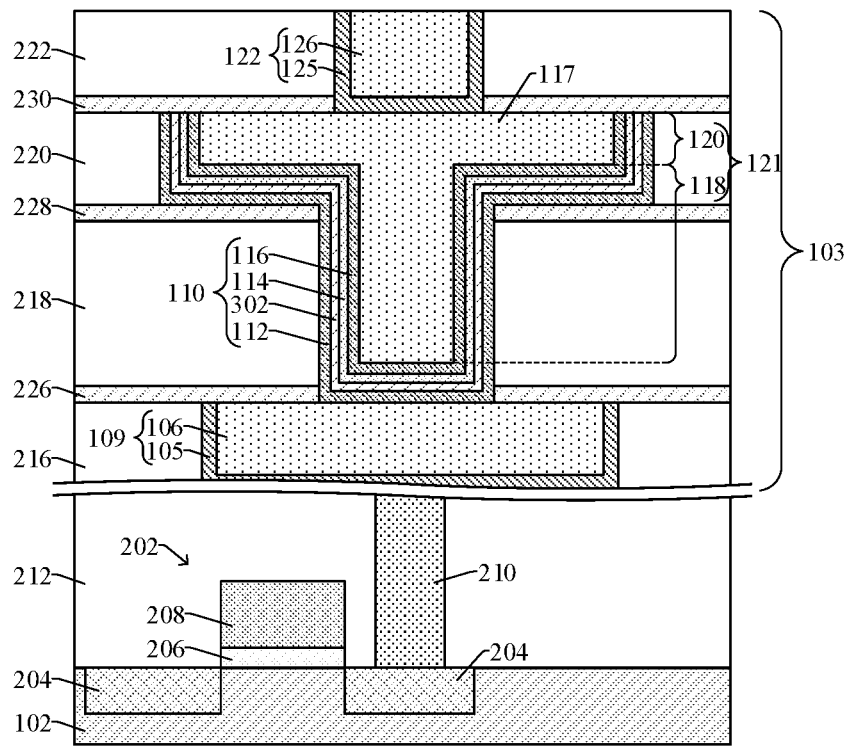

FIG. 3B illustrates a cross-sectional view 300b of some other embodiments of the integrated chip of FIG. 3A. In some embodiments, the insulator layer 302 is disposed directly between the ferroelectric layer 114 and the first electrode layer 112.

Figure 4A:
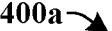
FIGS. 4A and 4B illustrate cross-sectional views of some other embodiments of the integrated chip of FIG. 2, where the ferroelectric structure comprises a semiconductor layer disposed on a ferroelectric layer.
Figure 4A:
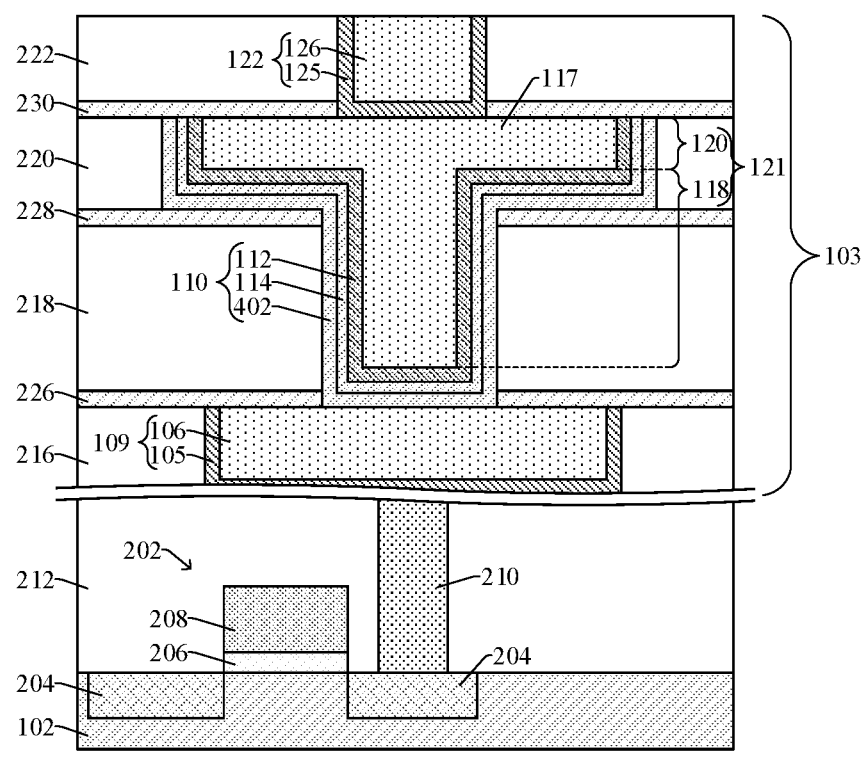

FIG. 4A illustrates a cross-sectional view 400a of some other embodiments of the integrated chip of FIG. 2, in which the ferroelectric structure comprises a semiconductor layer disposed on a ferroelectric layer.

As illustrated in FIG. 4A, in some embodiments, the second electrode layer (116 of FIG. 2) is omitted and the ferroelectric structure 110 further comprises a semiconductor layer 402 disposed on the ferroelectric layer 114. In such embodiments, the ferroelectric structure 110 is configured as a metal-ferroelectric-semiconductor (MFS) device. The semiconductor layer 402 may, for example, be or comprise silicon, epitaxial silicon, germanium, or some other suitable material. In various embodiments, a thickness of the semiconductor layer 402 is within a range of about 5 to 50 angstroms or some other suitable value. In further embodiments, the thickness of the semiconductor layer 402 being greater than about 5 angstroms facilitates the semiconductor layer 402 having a high-quality lattice structure. In yet further embodiments, the thickness of the semiconductor layer 402 being less than 50 angstroms increases a current across the ferroelectric structure 110, thereby facilitating performing accurate read and/or write processes on the ferroelectric structure 110 while maintaining a low power consumption of the ferroelectric structure 110. In some embodiments, the thickness of the semiconductor layer 402 is less than a thickness of the ferroelectric layer 114 and/or less than a thickness of the first electrode layer 112. In various embodiments, the semiconductor layer 402 is disposed along a lower surface of the ferroelectric layer 114 and/or directly contacts the first conductive interconnect structure 109. In such embodiments, the first electrode layer 112 directly contacts the second conductive body structure 117.

Figure 4B:
Figure 4B:
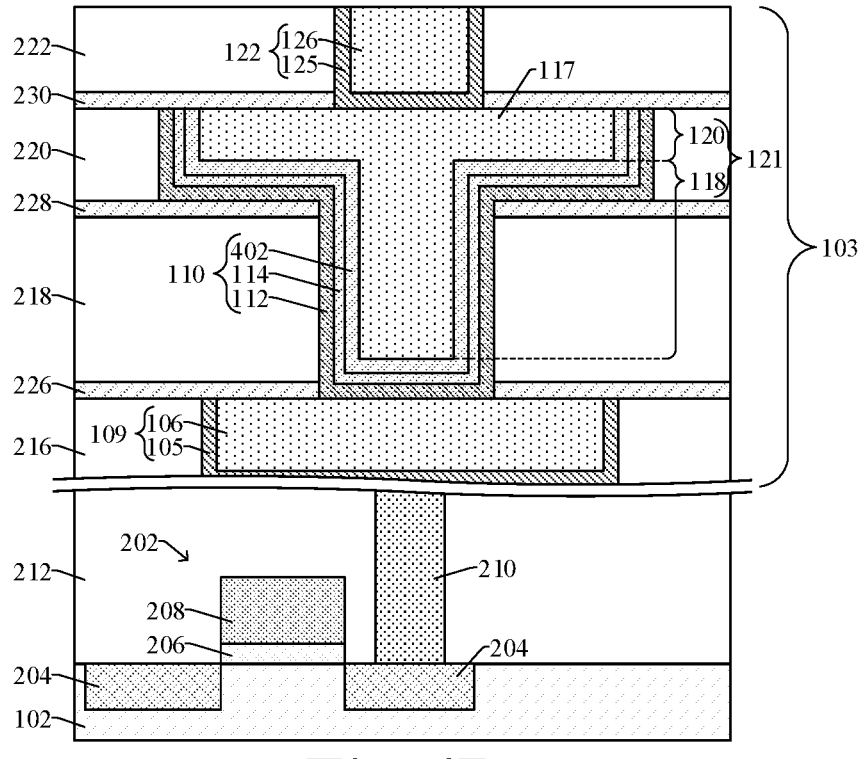

FIG. 4B illustrates a cross-sectional view 400b of some other embodiments of the integrated chip of FIG. 4A. In some embodiments, the semiconductor layer 402 is disposed directly between the ferroelectric layer 114 and the second conductive body structure 117, where the semiconductor layer 402 directly contacts the second conductive body structure 117. In such embodiments, the first electrode layer 112 is disposed along a lower surface of the ferroelectric layer and directly contacts the first conductive interconnect structure 109.

Figure 5A:
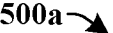
FIGS. 5A and 5B illustrate cross-sectional views of some other embodiments of the integrated chip of claim 2, where the ferroelectric structure comprises a semiconductor layer disposed between a ferroelectric layer and an electrode layer.
Figure 5A:
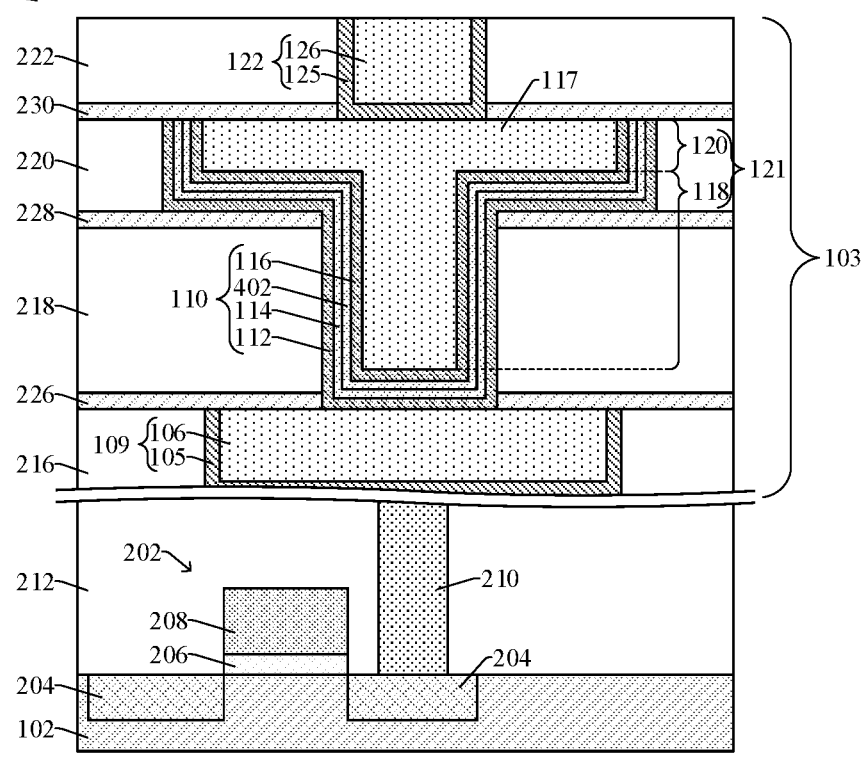

FIG. 5A illustrates a cross-sectional view 500a of some other embodiments of the integrated chip of FIG. 2, in which the ferroelectric structure comprises a semiconductor layer disposed between a ferroelectric layer and an electrode layer.

As illustrated in FIG. 5A, in some embodiments, the ferroelectric structure 110 comprises the first electrode layer 112, the ferroelectric layer 114, an insulator layer 302, and the second electrode layer 116. In such embodiments, the ferroelectric structure 110 is configured as a metal-ferro-electric-semiconductor-metal (MFSM) device. The semiconductor layer 402 may, for example, be or comprise silicon, epitaxial silicon, germanium, or some other suitable material. In various embodiments, a thickness of the semiconductor layer 402 is within a range of about 5 to 50 angstroms or some other suitable value. In further embodiments, the semiconductor layer 402 is disposed directly between the ferroelectric layer 114 and the second electrode layer 116.

Figure 5B:
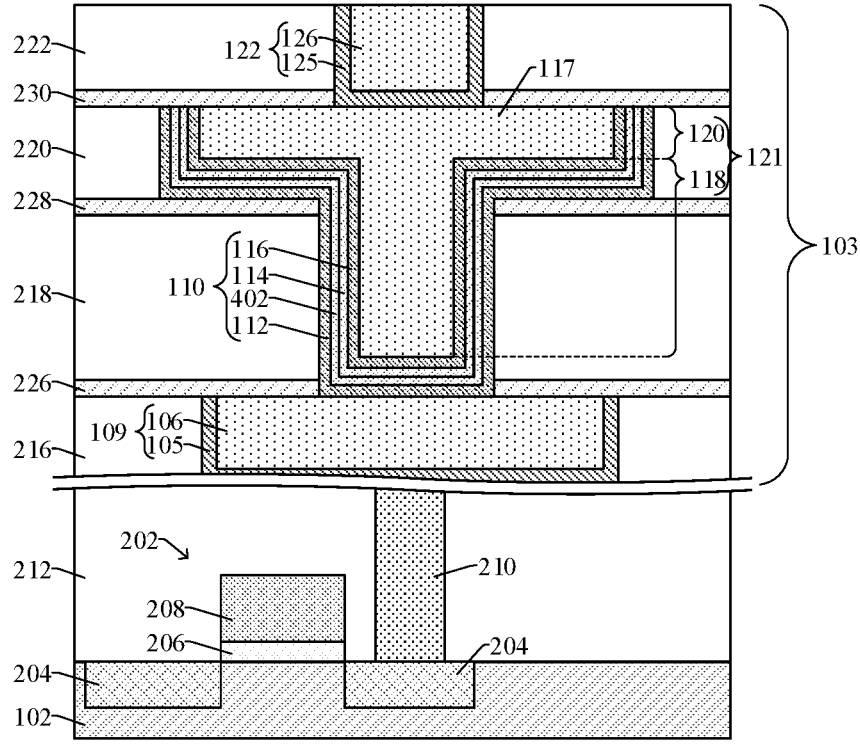

FIG. 5B illustrates a cross-sectional view 500b of some other embodiments of the integrated chip of FIG. 5A. In some embodiments, the semiconductor layer 402 is disposed directly between the ferroelectric layer 114 and the first electrode layer 112.

Figure 6:
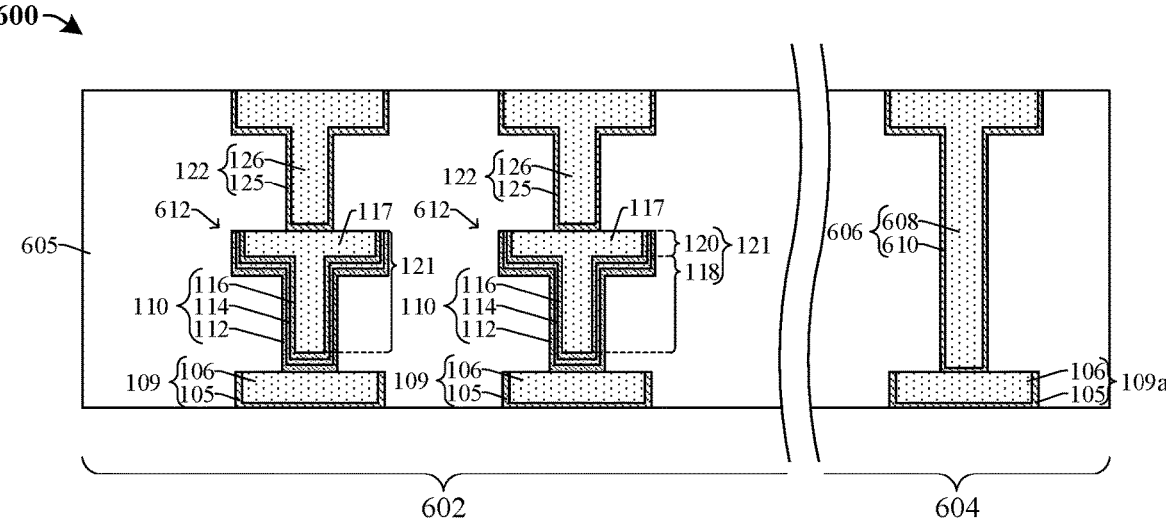
FIG. 6 illustrates a cross-sectional view of some embodiments of an integrated chip having an embedded memory region comprising a plurality of memory cells and a logic region laterally adjacent to the embedded memory region.

FIG. 6 illustrates a cross-sectional view 600 of some embodiments of an integrated chip having an embedded memory region comprising a plurality of memory cells and a logic region laterally adjacent to the embedded memory region.

As illustrated in FIG. 6, the integrated chip comprises a plurality of memory cells 612 disposed laterally within an embedded memory region 602. In various embodiments, the memory cells 612 respectively comprise a ferroelectric structure 110 lining a corresponding second conductive interconnect structure 121. The embedded memory region 602 is laterally adjacent to a logic region 604. A first logic conductive interconnect structure 109a disposed in a dielectric structure 605 and is spaced laterally within the logic region 604. A second logic conductive interconnect structure 606 is disposed within the logic region 604 and overlies the first logic conductive interconnect structure 109a. The second logic conductive interconnect structure 606 comprises a conductive body structure 608 and a conductive liner 610. The conductive body structure 608 comprises a conductive wire segment overlying a conductive via segment, wherein a height of the conductive via segment of the conductive body structure 608 is greater than a height of the ferroelectric structure 110.

Figure 7A:
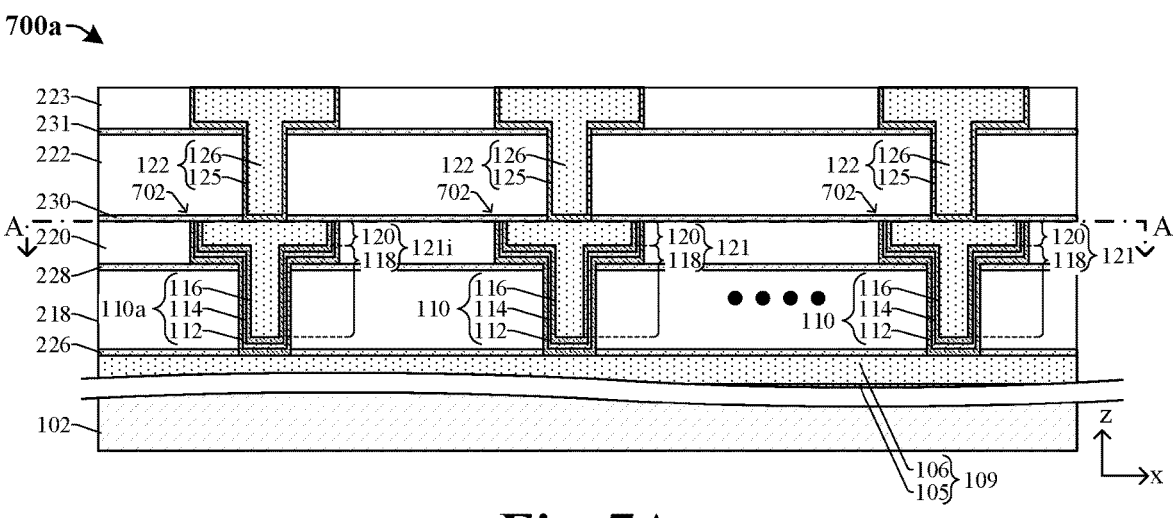
FIGS. 7A and 7B illustrate various views of some embodiments of an integrated chip comprising a plurality of memory cells disposed over a substrate.
Figure 7B:
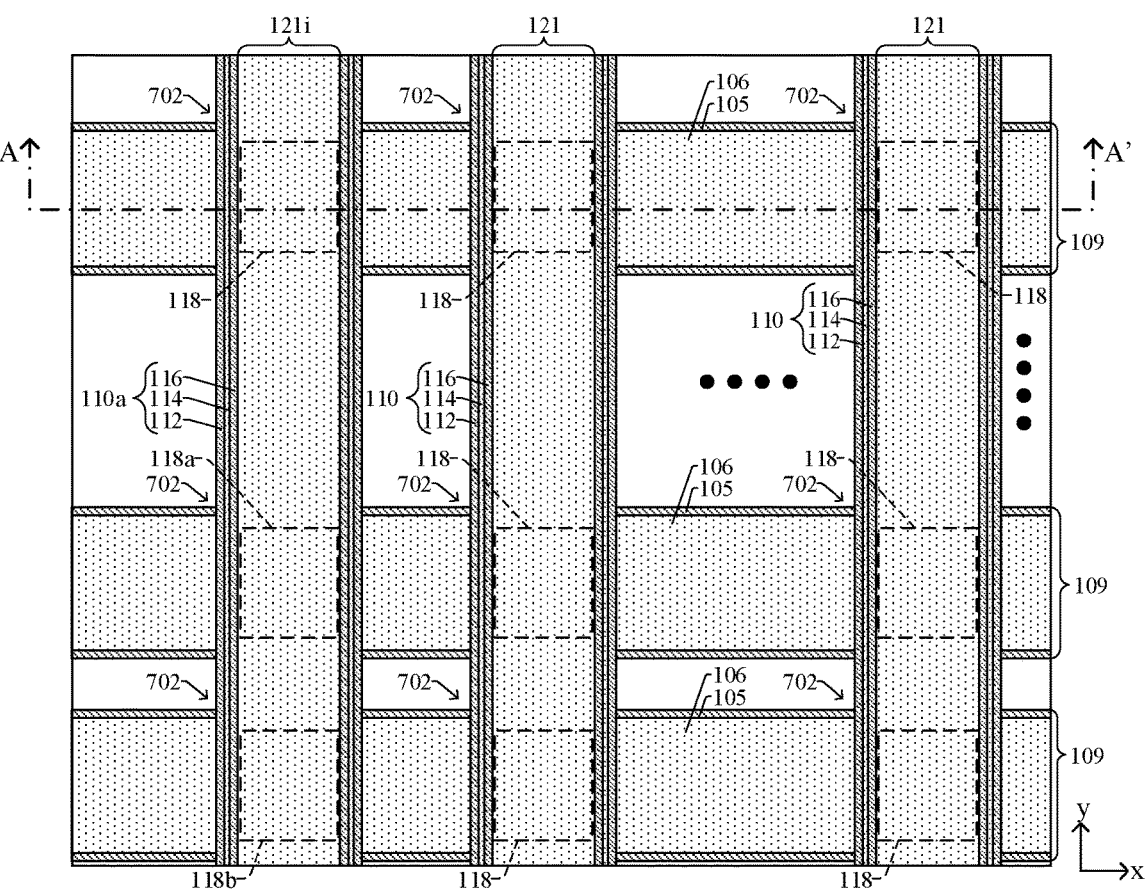

FIGS. 7A and 7B illustrate various views of some embodiments of an integrated chip comprising a plurality of memory cells disposed over a substrate. FIG. 7A illustrates a cross-sectional view 700a of some embodiments of the integrated chip. FIG. 7B illustrates a top view 700b of some embodiments of the integrated chip taken along line A-A' of FIG. 7A.

As illustrated in FIG. 7A, a plurality of memory cells 702 overlie the substrate 102. In various embodiments, the memory cells 702 respectively comprise at least a region of a corresponding ferroelectric structure 110 disposed between the conductive via and wire segments 118, 120 of a corresponding second conductive interconnect structure 121 and an underlying first conductive interconnect structure 109.

As illustrated in FIG. 7B, the integrated chip comprises a plurality of first conductive interconnect structures 109 extending laterally in a first direction (e.g., along the x-axis). The first conductive interconnect structures 109 are arranged in parallel with one another. Further a plurality of second conductive interconnect structures 121 respectively comprise a conductive wire segment (120 of FIG. 7A) extending laterally in a second direction (e.g., along the y-axis) transverse the first direction. The second conductive interconnect structures 121 are arranged in parallel with one another. In some embodiments, the first direction is orthogonal to the second direction. In various embodiments, the conductive wire segment (120 of FIG. 7A) of each second conductive interconnect structure 121 is configured as a bit line and the first conductive interconnect structures 109 may each be coupled to and/or configured as a word line. The plurality of memory cells 702 are arranged within a memory array comprising rows and columns. In various embodiments, memory cells 702 with a row of the memory array are operably coupled to a corresponding first conductive interconnect structure 109, while memory cells 702 within a column of the memory array are operably coupled to a corresponding conductive wire segment (120 of FIG. 7A) of a corresponding second conductive interconnect structure 121. As a result, each memory cell 702 is associated with an addressed defined by an intersection of a corresponding first conductive interconnect structure 109 and a corresponding second conductive interconnect structure 121.

In various embodiments, each second conductive interconnect structure 121 comprises a conductive via segment 118 directly overlying an underlying first conductive interconnect structure 109. For example, an individual second conductive interconnect structure 121i comprises a first conductive via segment 118a and a second conductive via segment 118b directly overlying a corresponding first conductive interconnect structure 109. The first conductive via segment 118a is laterally offset from the second conductive via segment 118b by a non-zero lateral distance. Further, the conductive wire segment (120 of FIG. 7A) of the individual second conductive interconnect structure 121i continuously laterally extends along the non-zero lateral distance from the first conductive via segment 118a to the second conductive via segment 118b. In various embodiments, a first ferroelectric structure 110a continuously laterally extends along opposing sidewalls and a bottom surface of the conductive wire segment (120 of FIG. 7A) of the individual second conductive interconnect structure 121*i* along the non-zero lateral distance. In yet further embodiments, the ferroelectric structures 110 respectively laterally wrap around an outer perimeter of each conductive via segment 118 of a corresponding second conductive interconnect structure 121 and is disposed along a bottom surface of each conductive via segment 118 of the corresponding second conductive interconnect structure 121.

FIGS. 8-16 illustrate cross-sectional views 800-1600 of some embodiments of a method for forming an integrated chip comprising a ferroelectric structure disposed along opposing sidewalls and a bottom surface of a conductive interconnect structure. Although the cross-sectional views 800-1600 shown in FIGS. 8-16 are described with reference to a method, it will be appreciated that the structures shown in FIGS. 8-16 are not limited to the method but rather may stand alone separate of the method. Although FIGS. 8-16 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 8:
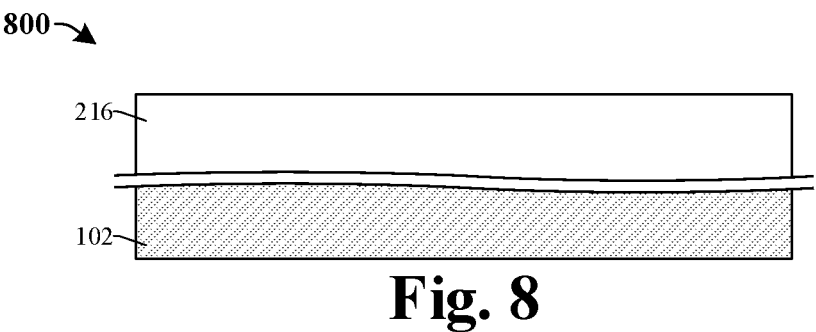
FIGS. 8-16 illustrate various cross-sectional views of some embodiments of a method for forming an integrated chip comprising a ferroelectric structure disposed along opposing sidewalls and a bottom surface of a conductive interconnect structure.

As shown in cross-sectional view 800 of FIG. 8, a first inter-metal dielectric (IMD) layer 216 is formed over a substrate 102. The substrate 102 may, for example, be or comprise silicon, monocrystalline silicon, a bulk substrate, a silicon-on-insulator (SOI) substrate, some other suitable substrate, or the like. The first IMD layer 216 may be formed over the substrate 102 by, for example, a chemical vapor deposition (CVD) process, a physical vapor deposition (PVD) process, an atomic layer deposition (ALD) process, or some other suitable deposition or growth process.

Figure 9:
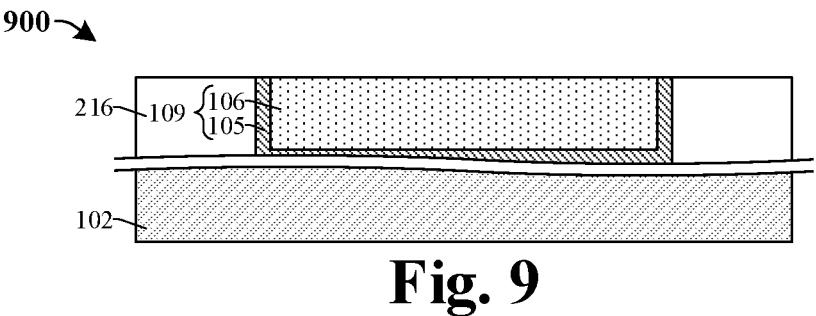

As shown in cross-sectional view 900 of FIG. 9, a first conductive interconnect structure 109 is formed within the first IMD layer 216. The first conductive interconnect structure 109 comprises a first conductive liner 105 and a first conductive body structure 106. The first conductive interconnect structure 109 may be formed by a first damascene process. In various embodiments, the first damascene process is a single damascene process and includes: performing a patterning process on the first IMD layer 216 to form an opening in the first IMD layer 216; depositing (e.g., by CVD, PVD, sputtering, etc.) the first conductive liner 105 over the first IMD layer 216 and lining the opening; depositing (e.g., by CVD, PVD, sputtering, electroplating, etc.) the first conductive body structure 106 over the first conductive liner 105, thereby filling the opening; and performing a planarization process (e.g., a chemical mechanical planarization (CMP) process) on the first conductive body structure 106 and the first conductive liner 105. In some embodiments, the patterning process includes forming a masking layer (not shown) over the first IMD layer 216 and performing an etching process (e.g., a dry etch) on the first IMD layer 216 with the masking layer in place, where the masking layer is removed during and/or after the etching process. The first conductive body structure 106 may, for example, be or comprise copper, aluminum, ruthenium, another conductive material, or any combination of the foregoing. The first conductive liner 105 may, for example, be or comprise titanium nitride, tantalum nitride, tantalum, titanium, or the like. In various embodiments, a top surface of the first conductive body structure 106 is coplanar with a top surface of the first conductive liner 105.

Figure 10:
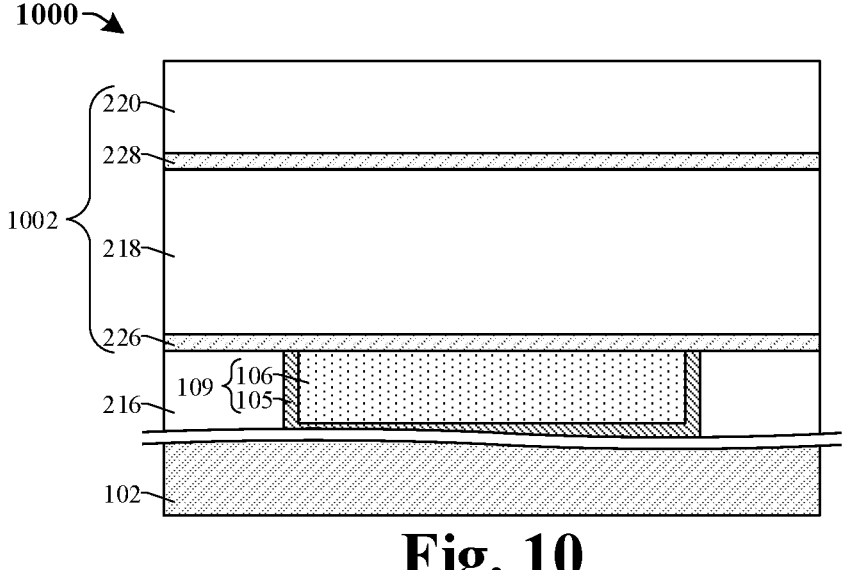

As shown in cross-sectional view 1000 of FIG. 10, a first dielectric structure 1002 is formed over the first conductive interconnect structure 109. In various embodiments, the first dielectric structure 1002 includes a first etch stop layer 226, a second IMD layer 218, a second etch stop layer 228, and a third IMD layer 220. The second IMD layer 218 is disposed between the first and second etch stop layers 226, 228 and the third IMD layer 220 overlies the second etch stop layer 228. In various embodiments, the first and second etch stop layers 226 and the second and third IMD layers 218, 220 are each formed by a corresponding deposition process such as a CVD process, a PVD process, an ALD process, or some other suitable formation or growth process.

Figure 11:
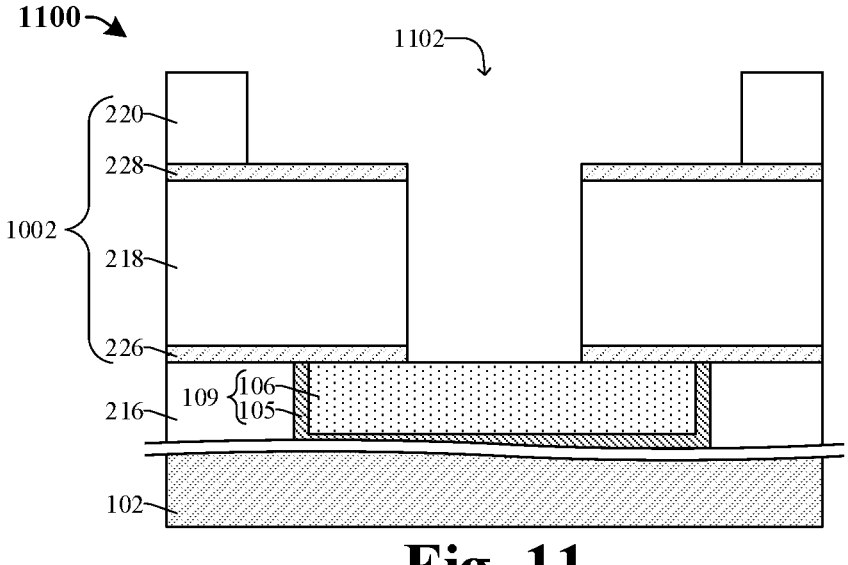

As shown in cross-sectional view 1100 of FIG. 11, a patterning process is performed on the first dielectric structure 1002 to form an opening 1102 over the first conductive interconnect structure 109. In various embodiments, the patterning process includes: forming a masking layer (not shown) over the first dielectric structure 1002 and performing an etching process (e.g., a dry etch, a wet etch, etc.) on the first dielectric structure 1002 according to the masking layer. The opening 1102 includes a lower opening portion corresponding to a first conductive feature opening (e.g., a via opening) and an upper opening portion corresponding to a second conductive feature opening (e.g., a wire opening). In some embodiments, the masking layer is removed during and/or after the etching process.

Figure 12:
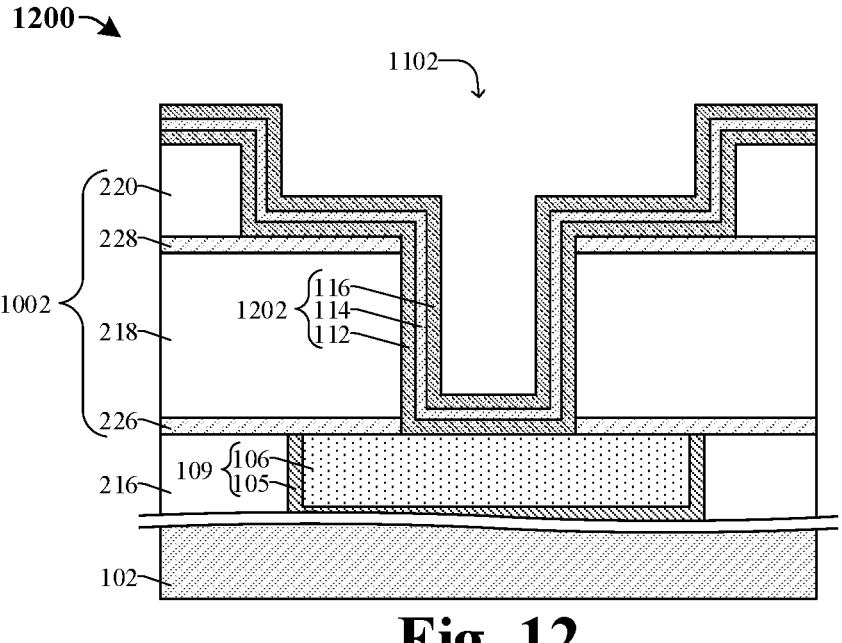

As shown in cross-sectional view 1200 of FIG. 12, a stack of ferroelectric layers 1202 is formed over the first dielectric structure 1002 and lines the opening 1102. In various embodiments, the stack of ferroelectric layers 1202 comprises a first electrode layer 112, a second electrode layer 116, and a ferroelectric layer 114 disposed between the first and second electrode layers 112, 116. The first electrode layer 112 is deposited on the first dielectric structure 1002 and the first conductive interconnect structure 109, the ferroelectric layer 114 is deposited on the first electrode layer 112, and the second electrode layer 116 is deposited on the ferroelectric layer 114. Each layer in the stack of ferroelectric layers 1202 may be formed by a corresponding deposition process. For example, the first electrode layer 112 may be formed by a first deposition process (e.g., CVD, PVD, sputtering, electroplating, etc.); the ferroelectric layer 114 may be formed by a second deposition process (e.g., CVD, PVD, ALD, etc.); and the second electrode layer 116 may be formed by a third deposition process (e.g., CVD, PVD, sputtering, electroplating, etc.). In yet further embodiments, the stack of ferroelectric layers 1202 may be formed such that the stack of ferroelectric layers 1202 comprises layers of the ferroelectric structure (e.g., 110 of FIG. 3A) as illustrated and/or described in FIG. 3A, 3B, 4A, 4B, 5A, or 5B.

Figure 13:
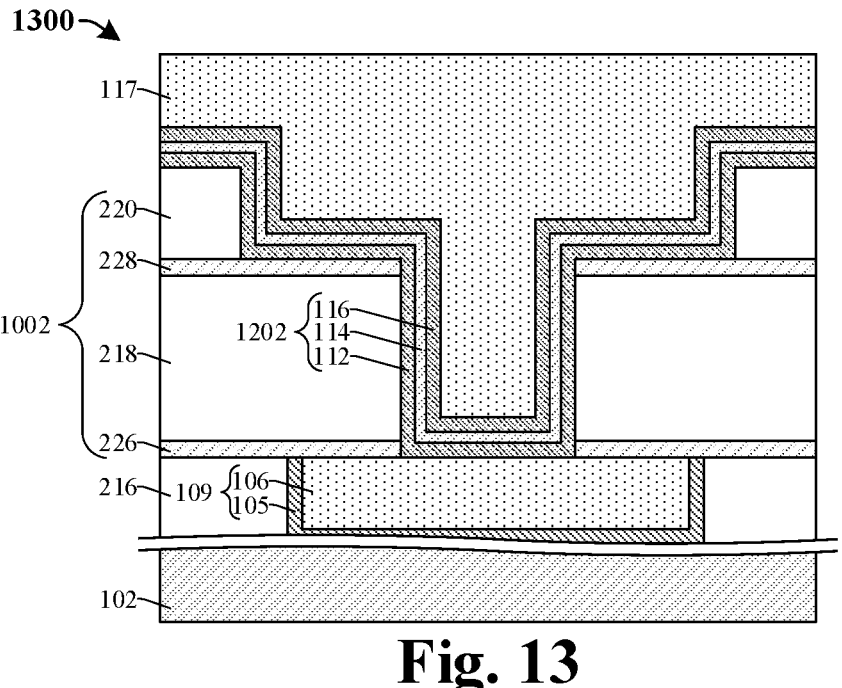

As shown in cross-sectional view 1300 of FIG. 13, a second conductive body structure 117 is formed over the stack of ferroelectric layers 1202, thereby filling a remaining portion of the opening (1102 of FIG. 12). The second conductive body structure 117 may, for example, be or comprise aluminum, copper, ruthenium, another conductive material, or any combination of the foregoing. The second conductive body structure 117 may be formed by depositing the second conductive body structure 117 on the stack of ferroelectric layers 1202 by, for example, CVD, PVD, sputtering, electroplating, electroless plating, or some other suitable growth or deposition process.

Figure 14:
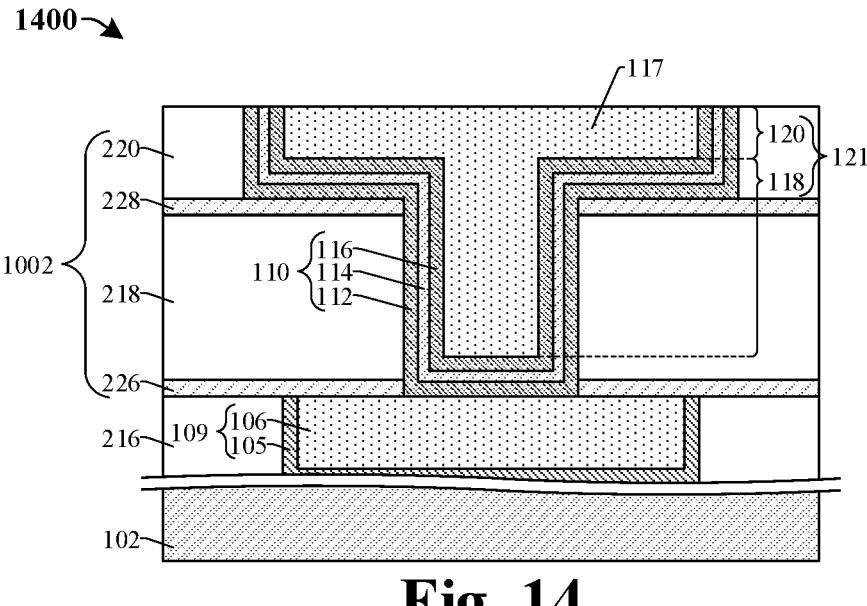

As shown in cross-sectional view 1400 of FIG. 14, a planarization process is performed on the stack of ferroelectric layers (1202 of FIG. 13) and the second conductive body structure 117, thereby defining a second conductive interconnect structure 121 and a ferroelectric structure 110. The second conductive interconnect structure 121 comprises the second conductive body structure 117 having a conductive wire segment 120 directly overlying a conductive via segment 118. Further, the ferroelectric structure 110 comprises the first and second electrode layers 112, 116 and the ferroelectric layer 114. In various embodiments, the second conductive interconnect structure 121 and the ferroelectric structure 110 are formed by a second damascene process (e.g., a dual damascene process). In some embodiments, the second damascene process includes the processing steps illustrated and/or described in FIGS. 11-13 and the planarization process of FIG. 14. Forming the second conductive interconnect structure 121 and the ferroelectric structure 110 by the second damascene process decreases costs and time associated with fabricating the integrated chip. In yet further embodiments, the planarization process includes performing a CMP process into the second conductive body structure 117 and the stack of ferroelectric layers (1202 of FIG. 13) until an upper surface of the first dielectric structure 1002 is reached. In yet further embodiments, top surfaces of the first and second electrode layers 112, 116, a top surface of the ferroelectric layer 114, and a top surface of the second conductive body structure 117 are coplanar with one another. Further, the ferroelectric structure 110 is formed concurrently with the second conductive interconnect structure 121.

Figure 15:
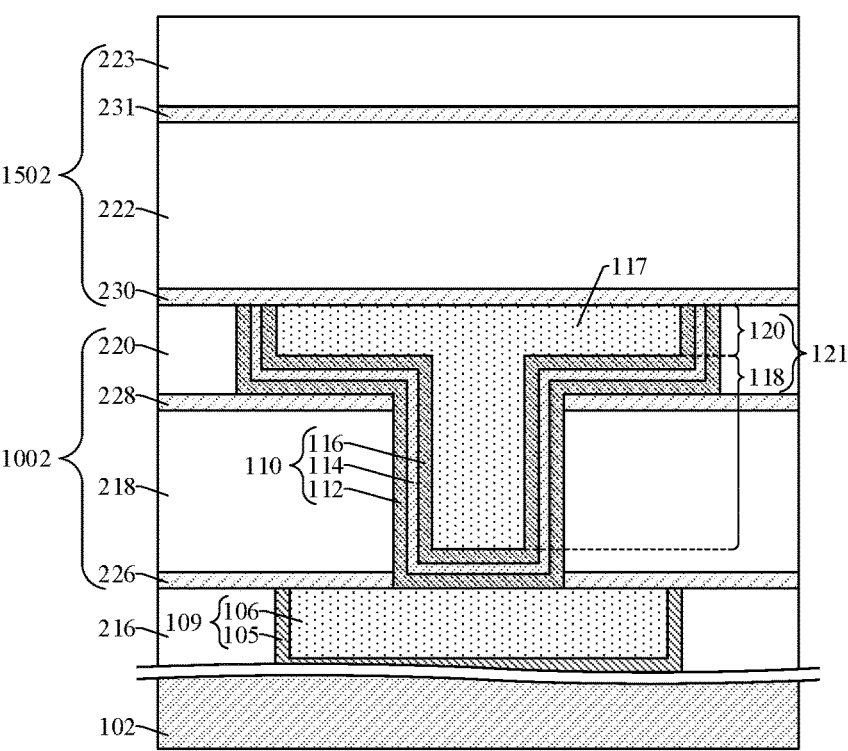

As shown in cross-sectional view 1500 of FIG. 15, a second dielectric structure 1502 is formed over the second conductive interconnect structure 121. In some embodiments, the second dielectric structure 1502 includes a third etch stop layer 230, a fourth IMD layer 222, a fourth etch stop layer 231, and a fifth IMD layer 223. The fourth IMD layer 222 is disposed between the third and fourth etch stop layers 230, 231 and the fifth IMD layer 223 overlies the fourth etch stop layer 231. In various embodiments, the third and fourth etch stop layers 230, 231 and the fourth and fifth IMD layers 222, 223 are each formed by a corresponding deposition process such as a CVD process, a PVD process, an ALD process, or some other suitable formation or growth process.

Figure 16:
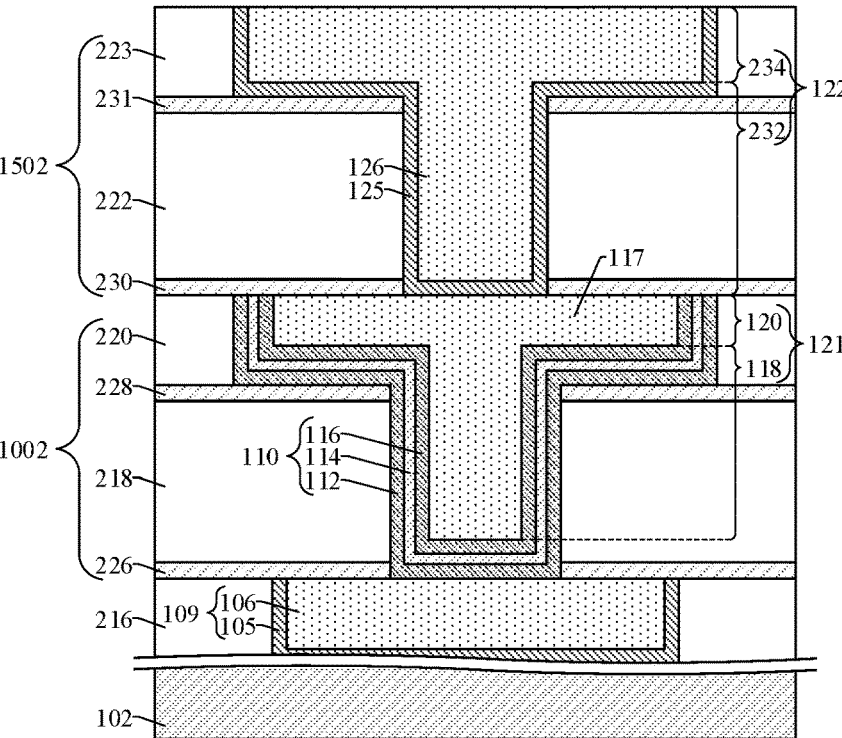

As shown in cross-sectional view 1600 of FIG. 16, a third conductive interconnect structure 122 is formed in the second dielectric structure 1502. The third conductive interconnect structure 122 comprises a third conductive body structure 126 and a second conductive liner 125 disposed between the third conductive body structure 126 and the second dielectric structure 1502. In various embodiments, the third conductive body structure 126 has an upper conductive wire segment 234 directly overlying an upper conductive via segment 232. The third conductive interconnect structure 122 may be formed by a third damascene process. In some embodiments, the third damascene process includes: performing a patterning process on the second dielectric structure 1502 to form an opening in the second dielectric structure 1502, the opening having a lower opening portion (e.g., corresponding to a via opening) and an upper opening portion (e.g., corresponding to a wire opening); depositing (e.g., by CVD, PVD, sputtering, etc.) the second conductive liner 125 over the second dielectric structure 1502 and lining the opening; depositing (e.g., by CVD, PVD, sputtering, electroplating, etc.) the third conductive body structure 126 over the second conductive liner 125, thereby filling the opening; and performing a planarization process (e.g., a CMP process) on the third conductive body structure 126 and the second conductive liner 125. In some embodiments, the patterning process includes forming a masking layer (not shown) over the second dielectric structure 1502 and performing an etching process (e.g., a dry etch) on the second dielectric structure 1502 with the masking layer in place, where the masking layer is removed during and/or after the etching process. The third conductive body structure 126 may, for example, be or comprise aluminum, copper, ruthenium, some other conductive material, or any combination of the foregoing. The second conductive liner 125 may, for example, be or comprise titanium nitride, tantalum nitride, tantalum, titanium, or the like. In yet further embodiments, the third damascene process is a dual damascene process.

FIG. 17 illustrates a flow diagram of some embodiments of a method 1700 of forming an integrated chip comprising a ferroelectric structure disposed along opposing sidewalls and a bottom surface of a conductive interconnect structure. Although the method 1700 is illustrated and/or described as a series of acts of events, it will be appreciated that the method 1700 is not limited to the illustrated ordering or acts. Thus, in some embodiments, the acts may be carried out in different orders than illustrated and/or may be carried out concurrently. Further, in some embodiments, the illustrated acts or events may be subdivided into multiple acts or events, which may be carried out at separate times or concurrently with other acts of sub-acts. In some embodiments, some illustrated acts or events may be omitted and other un-illustrated acts or events may be included.

At act 1702, a first conductive interconnect structure is formed over a substrate. The first conductive interconnect structure comprises a first conductive body structure and a first conductive liner. FIG. 9 illustrates a cross-sectional view 900 of some embodiments corresponding to act 1702.

At act 1704, a first dielectric structure is formed over the first conductive interconnect structure. FIG. 10 illustrates a cross-sectional view 1000 of some embodiments corresponding to act 1704.

At act 1706, a second conductive interconnect structure and a ferroelectric structure are formed within the first dielectric structure. The second conductive interconnect structure comprises a second conductive body structure having a conductive wire segment over a conductive via segment, and where the ferroelectric structure continuously extends along opposing sidewalls and a bottom surface of the conductive via and wire segments. In some embodiments, the second conductive interconnect structure and the ferroelectric structure may be formed according to acts 1708-1714.

At act 1708, the first dielectric structure is patterned to form an opening in the first dielectric structure over the first conductive interconnect structure. FIG. 11 illustrates a cross-sectional view 1100 of some embodiments corresponding to act 1708.

At act 1710, a stack of ferroelectric layers is formed over the first dielectric structure and lining the opening. FIG. 12 illustrates a cross-sectional view 1200 of some embodiments corresponding to act 1710.

At act 1712, the second conductive body structure is deposited over the stack of ferroelectric layers and within the opening. FIG. 13 illustrates a cross-sectional view 1300 of some embodiments corresponding to act 1712.

At act 1714, a planarization process is performed on the second conductive body structure and the stack of ferroelectric layers. FIG. 14 illustrates a cross-sectional view 1400 of some embodiments corresponding to act 1714.

At act 1716, a second dielectric structure is formed over the second conductive interconnect structure. FIG. 15 illustrates a cross-sectional view 1500 of some embodiments corresponding to act 1716.

At act 1718, a third conductive interconnect structure is formed within the second dielectric structure and over the second conductive interconnect structure. FIG. 16 illustrates a cross-sectional view 1600 of some embodiments corresponding to act 1718.

Accordingly, in some embodiments, the present disclosure relates to an integrated chip comprising a conductive interconnect structure including a conductive body structure having a conductive wire segment over a conductive via segment, where a ferroelectric structure continuously extends along opposing sidewalls and a bottom surface of the conductive via and wire segments.

In some embodiments, the present application provides an integrated chip including: a first conductive interconnect structure overlying a substrate; a second conductive interconnect structure overlying the first conductive interconnect structure, wherein the second conductive interconnect structure comprises a conductive wire segment directly overlying a conductive via segment; and a ferroelectric structure disposed between the first conductive interconnect structure and the second conductive interconnect structure, wherein the ferroelectric structure continuously extends along opposing sidewalls and a bottom surface of the conductive wire segment and along opposing sidewalls and a bottom surface of the conductive via segment. In an embodiment, a top surface of the ferroelectric structure is coplanar with a top surface of the second conductive interconnect structure. In an embodiment, the ferroelectric structure comprises a first electrode layer, a second electrode layer, and a ferroelectric layer disposed between the first and second electrode layers, wherein the first electrode layer, the second electrode layer, and the ferroelectric layer respectively line the opposing sidewalls and the bottom surfaces of the conductive wire and via segments. In an embodiment, the ferroelectric structure further comprises an insulator layer disposed between the first electrode layer and the ferroelectric layer. In an embodiment, the ferroelectric structure further comprises a semiconductor layer disposed between the first electrode layer and the ferroelectric layer. In an embodiment, the first conductive interconnect structure comprises a conductive body structure and a conductive liner disposed along sidewalls and a bottom surface of the conductive body structure, wherein a thickness of the conductive liner is greater than a thickness of the ferroelectric layer. In an embodiment, a top surface of the first conductive interconnect structure is separated from a top surface of the second conductive interconnect structure by a vertical distance, wherein a height of the ferroelectric structure is equal to the vertical distance. In an embodiment, the ferroelectric structure comprises a first electrode layer, a semiconductor layer, and a ferroelectric layer disposed between the first electrode layer and the semiconductor layer. In an embodiment, the first electrode layer directly contacts the first conductive interconnect structure and the semiconductor layer directly contacts the first conductive interconnect structure.

In further embodiments, the present application provides an integrated chip, including: a substrate; a transistor disposed on the substrate and comprising a gate electrode over the substrate and a pair of source/drain regions disposed in the substrate on opposing sides of the gate electrode; a first conductive interconnect structure directly electrically coupled to an individual source/drain region in the pair of source/drain regions; a second conductive interconnect structure overlying and electrically coupled to the first conductive interconnect structure, wherein the second conductive interconnect structure comprises a conductive wire segment over a first conductive via segment; and a ferroelectric structure comprising an upper ferroelectric segment over a lower ferroelectric segment, wherein the upper ferroelectric segment contacts opposing sidewalls and a bottom surface of the conductive wire segment, wherein the lower ferroelectric segment contacts opposing sidewalls and a bottom surface of the first conductive via segment. In an embodiment, the integrated chip further includes a first etch stop layer disposed along a top surface of the first conductive interconnect structure, wherein the first etch stop layer laterally wraps around the lower ferroelectric segment. In an embodiment, the integrated chip further includes a second etch stop layer disposed along a bottom surface of the upper ferroelectric segment, wherein the upper ferroelectric segment continuously extends from a top surface of the second etch stop layer to the bottom surface of the conductive wire segment. In an embodiment, a width of the upper ferroelectric segment is greater than a width of the lower ferroelectric segment, and wherein a height of the upper ferroelectric segment is less than a height of the lower ferroelectric segment. In an embodiment, the first conductive interconnect structure comprises a first conductive body structure and a conductive liner disposed along sidewalls and a bottom surface of the first conductive body structure, wherein the ferroelectric structure comprises a first electrode layer, a second electrode layer, and a ferroelectric layer disposed between the first and second electrode layers, wherein the conductive liner, the first electrode layer, and the second electrode layer respectively comprise a conductive material. In an embodiment, a height of the first conductive interconnect structure is less than a height of the lower ferroelectric segment.

In yet further embodiments, the present application provides a method for forming an integrated chip, the method includes: forming a first conductive interconnect structure over a substrate; depositing a first dielectric structure over the first conductive interconnect structure; patterning the first dielectric structure to form an opening in the first dielectric structure over the first conductive interconnect structure, wherein the opening comprises a wire opening portion overlying a via opening portion; depositing a stack of ferroelectric layers over the first dielectric structure and lining the wire opening portion and the via opening portion; depositing a conductive body structure over the stack of ferroelectric layers and filling the opening; and performing a planarization process on the conductive body structure and the stack of ferroelectric layers, thereby defining a second conductive interconnect structure and a ferroelectric structure. In an embodiment, the conductive body structure comprises a conductive wire segment over a conductive via segment, wherein the ferroelectric structure lines sidewalls and bottom surfaces of the conductive via and wire segments. In an embodiment, forming the first dielectric structure includes: depositing a first etch stop layer on the first conductive interconnect structure; depositing a first dielectric layer over the first etch stop layer; depositing a second etch stop layer over the first dielectric layer; and depositing a second dielectric layer over the second etch stop layer, wherein an upper portion of the ferroelectric structure is disposed directly between the second etch stop layer and the bottom surface of the conductive wire segment. In an embodiment, a top surface of the second conductive interconnect structure, a top surface of the ferroelectric structure, and a top surface of the first dielectric structure are coplanar with one another. In an embodiment, a height of the ferroelectric structure is greater than a height of the second conductive interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
a first conductive interconnect structure overlying a substrate, wherein the first conductive interconnect structure comprises a conductive body structure and a conductive liner disposed along sidewalls and a bottom surface of the conductive body structure;
a second conductive interconnect structure overlying the first conductive interconnect structure, wherein the second conductive interconnect structure comprises a conductive wire segment directly overlying a conductive via segment; and
a ferroelectric structure disposed between the first conductive interconnect structure and the second conductive interconnect structure, wherein the ferroelectric structure continuously extends along opposing sidewalls and a bottom surface of the conductive wire segment and along opposing sidewalls and a bottom surface of the conductive via segment, wherein the ferroelectric structure comprises a first electrode layer, a second electrode layer, and a ferroelectric layer between the first and second electrode layers, wherein the first electrode layer, the second electrode layer, and the ferroelectric layer respectively line the opposing sidewalls and the bottom surfaces of the conductive wire and via segments, wherein a thickness of the conductive liner is greater than a thickness of the ferroelectric layer.

2. The integrated chip of claim 1, wherein a top surface of the ferroelectric structure is coplanar with a top surface of the second conductive interconnect structure.

3. The integrated chip of claim 1, wherein the ferroelectric structure further comprises an insulator layer disposed between the first electrode layer and the ferroelectric layer.

4. The integrated chip of claim 1, wherein the ferroelectric structure further comprises a semiconductor layer disposed between the first electrode layer and the ferroelectric layer.

5. The integrated chip of claim 1, wherein a top surface of the first conductive interconnect structure is separated from a top surface of the second conductive interconnect structure by a vertical distance, wherein a height of the ferroelectric structure is equal to the vertical distance.

6. The integrated chip of claim 1, wherein the ferroelectric structure comprises a semiconductor layer between the ferroelectric layer and either the first electrode layer or the second electrode layer.

7. The integrated chip of claim 6, wherein a thickness of the semiconductor layer is less than the thickness of the ferroelectric layer.

8. An integrated chip comprising:
a substrate;
a transistor disposed on the substrate and comprising a gate electrode over the substrate and a pair of source/ drain regions disposed in the substrate on opposing sides of the gate electrode;
a first conductive interconnect structure directly electrically coupled to an individual source/drain region in the pair of source/drain regions;
a second conductive interconnect structure overlying and electrically coupled to the first conductive interconnect structure, wherein the second conductive interconnect structure comprises a conductive wire segment over a first conductive via segment; and
a ferroelectric structure comprising an upper ferroelectric segment over a lower ferroelectric segment, wherein the upper ferroelectric segment contacts opposing sidewalls and a bottom surface of the conductive wire segment, wherein the lower ferroelectric segment contacts opposing sidewalls and a bottom surface of the first conductive via segment, wherein the ferroelectric structure comprises a first electrode layer, a ferroelectric layer, and an insulator layer between the ferroelectric layer and either the first electrode layer or the second conductive interconnect structure, wherein a thickness of the ferroelectric layer is less than a thickness of the first electrode layer and is greater than a thickness of the insulator layer.

9. The integrated chip of claim 8, further comprising:
a first etch stop layer disposed along a top surface of the first conductive interconnect structure, wherein the first etch stop layer laterally wraps around the lower ferroelectric segment.

10. The integrated chip of claim 9, further comprising:
a second etch stop layer disposed along a bottom surface of the upper ferroelectric segment, wherein the upper ferroelectric segment continuously extends from a top surface of the second etch stop layer to the bottom surface of the conductive wire segment.

11. The integrated chip of claim 8, wherein a width of the upper ferroelectric segment is greater than a width of the lower ferroelectric segment, and wherein a height of the upper ferroelectric segment is less than a height of the lower ferroelectric segment.

12. The integrated chip of claim 8, wherein the first conductive interconnect structure comprises a first conductive body structure and a conductive liner disposed along sidewalls and a bottom surface of the first conductive body structure, wherein the ferroelectric structure comprises a second electrode layer between the ferroelectric layer and the second conductive interconnect structure, wherein the conductive liner, the first electrode layer, and the second electrode layer respectively comprise a same conductive material.

13. The integrated chip of claim 8, wherein a height of the first conductive interconnect structure is less than a height of the lower ferroelectric segment.

14. The integrated chip of claim 8, wherein the ferroelectric layer comprises one or more of lead zirconate titanate (PZT), barium titanate (BTO), strontium bismuth tantalate (SBT), and a doped metal oxide.

15. The integrated chip of claim 8, wherein the insulator layer comprises an amorphous material.

16. A method for forming an integrated chip, comprising:
forming a first conductive interconnect structure over a substrate;
depositing a first dielectric structure over the first conductive interconnect structure;
patterning the first dielectric structure to form an opening in the first dielectric structure over the first conductive interconnect structure, wherein the opening comprises a wire opening portion overlying a via opening portion;

depositing a stack of layers over the first dielectric structure and lining the wire opening portion and the via opening portion, wherein the stack of layers comprises a first electrode layer, a semiconductor layer, and a ferroelectric layer between the first electrode layer and the semiconductor layer;

depositing a conductive body structure over the stack of layers and filling the opening; and performing a planarization process on the conductive body structure and the stack of layers, thereby defining a second conductive interconnect structure and a ferroelectric structure.

17. The method of claim 16, wherein the conductive body structure comprises a conductive wire segment over a conductive via segment, wherein the ferroelectric structure lines sidewalls and bottom surfaces of the conductive via and wire segments.

18. The method of claim 17, wherein forming the first dielectric structure comprises:

depositing a first etch stop layer on the first conductive interconnect structure;

depositing a first dielectric layer over the first etch stop layer;

depositing a second etch stop layer over the first dielectric layer; and depositing a second dielectric layer over the second etch stop layer, wherein an upper portion of the ferroelectric structure is disposed directly between the second etch stop layer and the bottom surface of the conductive wire segment.

19. The method of claim 16, wherein a top surface of the second conductive interconnect structure, a top surface of the ferroelectric structure, and a top surface of the first dielectric structure are coplanar with one another.

20. The method of claim 16, wherein a height of the ferroelectric structure is greater than a height of the second conductive interconnect structure.

* * * * *